United States Patent
Chevallier

[19]

[11] Patent Number: 5,949,708
[45] Date of Patent: Sep. 7, 1999

[54] INTEGRATED CIRCUIT CHARGE COUPLING CIRCUIT

[75] Inventor: Christopher J. Chevallier, Palo Alto, Calif.

[73] Assignee: Micron Technology, Inc., Boise, Id.

[21] Appl. No.: 09/001,793

[22] Filed: Dec. 31, 1997

[51] Int. Cl.$^6$ .................................................. G11C 11/34
[52] U.S. Cl. ............... 365/183; 365/185.33; 365/185.01; 365/100
[58] Field of Search .................. 365/185.18, 185.23, 365/185.25, 185.33, 100, 102, 148, 243, 175, 189.09, 183, 185.01

[56] References Cited

U.S. PATENT DOCUMENTS

| | | | |
|---|---|---|---|
| 4,628,214 | 12/1986 | Leuschner | 327/536 |
| 4,935,644 | 6/1990 | Tsujimoto | 307/296 |
| 5,012,132 | 4/1991 | Wang | 307/296.1 |
| 5,301,157 | 4/1994 | Roberts . | |
| 5,592,370 | 1/1997 | Rogers | 363/60 |
| 5,663,907 | 9/1997 | Frayer et al. | 365/185.18 |
| 5,818,758 | 10/1998 | Wojciechowski | 365/185.18 |

OTHER PUBLICATIONS

"Compact Flash 4–15 MB", *Flash Memory Data Book*, Micron Quantum Devices, Inc., 3–1:3–4, (1997).

*Primary Examiner*—David Nelms
*Assistant Examiner*—Thong Le
*Attorney, Agent, or Firm*—Schwegman, Lundberg, Woessner & Kluth P.A.

[57] ABSTRACT

A charge pump coupling circuit is described for more efficiently coupling a final capacitive stage of a charge pump to a capacitive load. The coupling circuit is has primarily resistive characteristics to allow for a greater load voltage. The resistive coupling circuit in one embodiment is included in a memory device for coupling a charge pump to a memory array word line. The resistive coupling circuit can be either a single resistor, a plurality of resistors, or a coupling circuit which has substantially resistive characteristics.

47 Claims, 5 Drawing Sheets

INTEGRATED CIRCUIT CHARGE COUPLING CIRCUIT

TECHNICAL FIELD OF THE INVENTION

The present invention relates generally to integrated circuits and in particular the present invention relates to charge pump coupling circuitry.

BACKGROUND OF THE INVENTION

Charge pumps are well known in the art as an on-chip voltage regulator capable of providing a voltage more positive than the most positive external power supply voltage and/or negative voltage in the absence of a negative power supply voltage. The pump voltage is provided by a charge stored on a charge capacitor. The advantages of charge pumps are also well known in the art, for example, such as providing a bias voltage for the substrate of an integrated circuit or n-type and p-type wells, or for providing greater output voltage swings.

Many types of integrated circuit memories require several different power levels for operation. Some of these power levels exceed the available potential range of the external power supplies used to power the circuit. For example, access transistors connected to dynamic memory cells typically use a pumped voltage (Vccp) to drive their gates above the most positive power supply voltage. The Vccp is typically provided by a charge pump and is used to allow a complete charge to be written to the memory cell. If a lower voltage were used as the gate potential, such as the supply voltage Vcc, a threshold voltage (Vt) would be lost between the source and drain, such that a full source voltage could not reach the drain. Further, a charge pump is typically employed in non-volatile memory systems, such as flash memory systems, to provide voltages required for programming and erasing memory cells in a non-volatile memory.

Most charge pumps use an oscillator circuit, such as a ring oscillator, to provide a square wave or pulse train having voltage swings typically between ground and the most positive external supply voltage, Vcc. The pumped voltage level is partially controlled by the ring oscillator. That is, the pumped charge is generated when the ring oscillator cycles high. The ring oscillator, therefore, has an active half-cycle and an inactive half-cycle. A charge capacitor is typically pre-charged during the inactive half-cycle. The capacitor charge is then pumped to a higher level by charge sharing with another capacitor when the ring oscillator transitions to the active half-cycle. To reduce the amount of inactive time, charge pumps can have more than one phase where each phase operates on either the high or low transition of the ring oscillator.

A charge pump typically includes several pump stages which each include a pump capacitor which is charged and discharged during a clock cycle of the charge pump. A stage diode is coupled between the pump capacitor and the stage input voltage to prevent discharging of the pump capacitor prior to the pump capacitor having additional charge placed on it. Thus, a charge pump progressively stores more charge on the capacitor component of each stage, and several such stages being placed together in the charge pump produce an increasing voltage level. In integrated circuits, the diode and the capacitor are typically formed from properly configured transistors.

One or more clock signals typically trigger the charging of the pump capacitors. A typical clock signal has a clock frequency with a time period somewhat less than the discharge time of the pump capacitors. In one such design, two clock signals having opposite phase trigger the charging of alternate stages of a multi-stage charge pump. The opposite phase clock signals in this design permit increasing the amount of charge which can be placed on the pump capacitors.

A conventional pump circuit 20 is illustrated generally in schematic diagram form in FIG. 1A. Pump circuit 20 receives an input supply voltage on a line 22. A first clock signal Ph1 is received on a line 24 and a second clock signal Ph2 having the opposite phase of clock signal Ph1 is received on a line 26. FIG. 1B illustrates typical square wave clock signals Ph1 and Ph2 in timing diagram form. As illustrated in FIG. 1B, clock signals Ph1 and Ph2 have opposite phases and amplitudes corresponding to the amplitude to the input supply voltage on line 22. The input supply voltage on line 22 provides the initial supply of charge for pump circuit 20.

Pump circuit 20 includes N pump stages, as represented by a first pump stage 28 and a second pump stage 30. Clock signal Ph1 is coupled to the first pump stage 28 and clock signal Ph2 is coupled to the second pump stage 30. Similarly, clock signals Ph1 and Ph2 are alternately coupled to the remaining N-2 pump stages of pump circuit 20. Each of the N pump stages comprise a stage transistor figured to function as a diode, such as indicated at 32a for first pump stage 28 and at 32b for second pump stage 30. Each pump stage also includes a pump capacitor, such as indicated at 34a for pump stage 28 and at 34b for pump stage 30. Stage transistors 32a and 32b are typically configured to act as diodes by connecting the gate of the transistor to its drain. Pump capacitor 34a is coupled between clock signal Ph1 and the first stage output node VS1 and pump capacitor 34b is coupled between clock signal Ph2 and the second stage output node VS2.

The N pump stages are connected in a serial manner to eventually produce an Nth stage output voltage on a line 40. The Nth stage output voltage is provide to an output transistor 42. Output transistor 42 is configured to act as a diode by connecting its gate to its drain and provides a pump output voltage on a line 44.

A capacitive load 50 is coupled to the charge pump via diode connected transistor 42. The load is shown as a capacitor to emphasize the essentially capacitive nature of the load. A disadvantage of using the diode coupled transistor 42 as an isolation device is a decrease load voltage due to a voltage drop across the transistor. Under a back bias condition, a voltage drop of 2–3 volts can be experienced. As a result, an integrated circuit charge pump must be designed to produce a higher voltage on its last stage than the resultant voltage desired on the load. Because of processing technology constraints, such as junction breakdown, designing a charge pump to produce a higher output voltage is not always possible.

For the reasons stated above, and for other reasons stated below which will become apparent to those skilled in the art upon reading and understanding the present specification, there is a need in the art for a coupling circuit which allows a charge pump to be designed without the need for an elevated output voltage.

SUMMARY OF THE INVENTION

The above mentioned problems with integrated circuits and other problems are addressed by the present invention and which will be understood by reading and studying the following specification. An integrated circuit is described which includes a charge pump circuit coupled to a capacitive load via a resistive coupling circuit.

In particular, the present invention describes a flash memory device comprising an array of non-volatile memory cells comprising a plurality of substantially capacitive word lines for accessing the memory cells, a charge pump for producing a output voltage selectively coupled to the plurality of word lines, and a diodeless coupling resistor circuit connected between a capacitive output of the charge pump and decode circuitry coupled to the plurality of word lines for producing a word line voltage In another embodiment, a memory device comprising a charge pump comprising a plurality of series coupled capacitive stages for producing an output voltage which is greater than an input voltage of the charge pump, a capacitive load circuit coupled to an output of the charge pump, and a coupling circuit connected to the output of the charge pump and the capacitive load circuit. The coupling circuit comprising a diodeless coupling circuit connected to the output of the charge pump and the capacitive load circuit. The coupling circuit comprising a purely resistive circuit such that an upper voltage level coupled to the capacitive load circuit is less than an n-type transistor voltage drop below the upper voltage level produced by the charge pump.

In yet another embodiment, a method is described for increasing a load voltage on a purely capacitive load of an integrated circuit from a charge pump. The method comprises the steps of generating a charge pump output voltage having an upper voltage level, and coupling an output stage of the charge pump to the purely capacitive load through a resistive coupling circuit, whereby a load voltage of the purely capacitive load has an upper voltage level which is less than an n-type transistor voltage drop below the upper voltage level produced by the charge pump.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

One type of integrated circuit which is well suited to benefit from the coupling circuit of the present invention is an integrated memory device. The memory device can be any configuration, including but not limited to DRAM, SRAM, EEPROM, and Flash EPROM. Prior to describing the coupling circuit, a brief description is provided of a Flash memory which can incorporate the coupling circuit.

Flash Memory

Figure 2A:
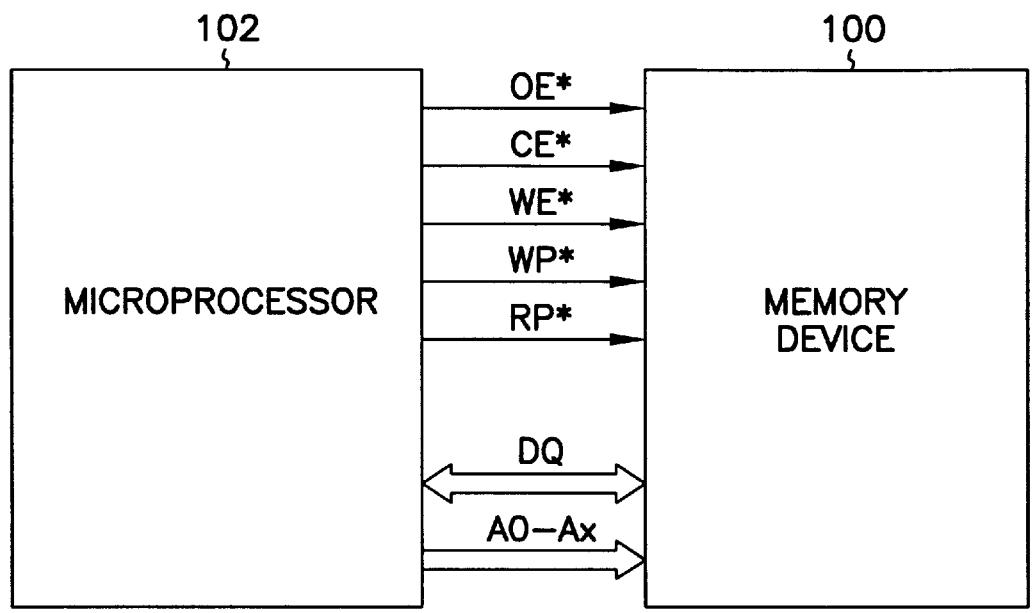
FIG. 2A is a block diagram of a flash memory system.

FIG. 2A illustrates a block diagram of a basic Flash memory device 100 which is coupled to a microprocessor, or memory controller 102. The memory device has been simplified to focus on features of the memory which are helpful in understanding the present invention. The memory device 100 includes an array of non-volatile memory cells 104, FIG. 2B. The memory cells are preferably floating gate memory cells. The array is arranged in rows and columns, with the rows arranged in blocks. The blocks allow memory cells to be erased in blocks. Data, however, is stored in the memory array separate from the block structure. Erase operations, therefore, are performed much faster.

An x-decoder 108 and a y-decoder 110 are provided to decode address signals provided on address lines A0–Ax 112. An address buffer circuit 106 is provided to latch the address signals. Address signals are received and decoded to access the memory array 104. A y-select circuit 116 is provided to select a column of the array identified with the y-decoder 110. Sense amplifier and compare circuitry 118 is used to sense data stored in the memory cells and verify the accuracy of stored data. Data input 120 and output 122 buffer circuits are included for bidirectional data communication over a plurality of data (DQ) lines with the microprocessor 102. Command control circuit 114 decodes signals provided on control lines from the microprocessor. These signals are used to control the operations of the memory, including data read, data write, and erase operations. Input/output control circuit 124 is used to control the input and output buffers in response to some of the control signals. The memory includes an internal circuitry in command control circuit 114 for generating timing signals. As stated above, the Flash memory of FIG. 2A has been simplified to facilitate a basic understanding of the features of the memory. A more detailed understanding of Flash memories is known to those skilled in the art. See "1997 Flash Memory Data Book" pages 2-5 to 2-33 available from Micron Quantum Devices, Inc. (incorporated herein by reference) for a more detailed description of a Flash memory.

Figure 2C:
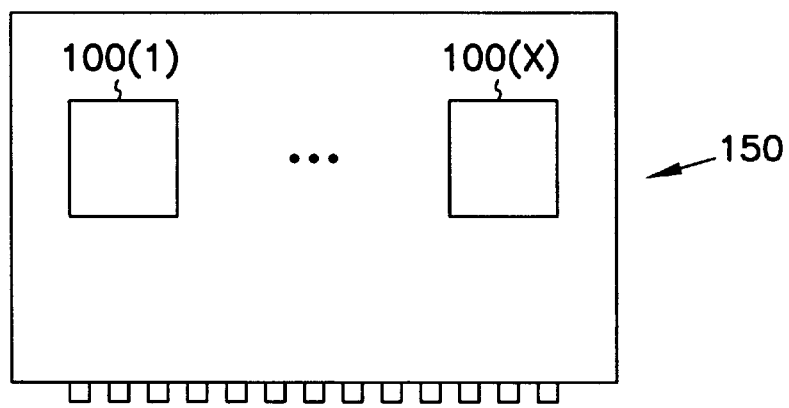
FIG. 2C is a diagram of a memory card including several flash memories of FIG. 2B.
Figure 2B:
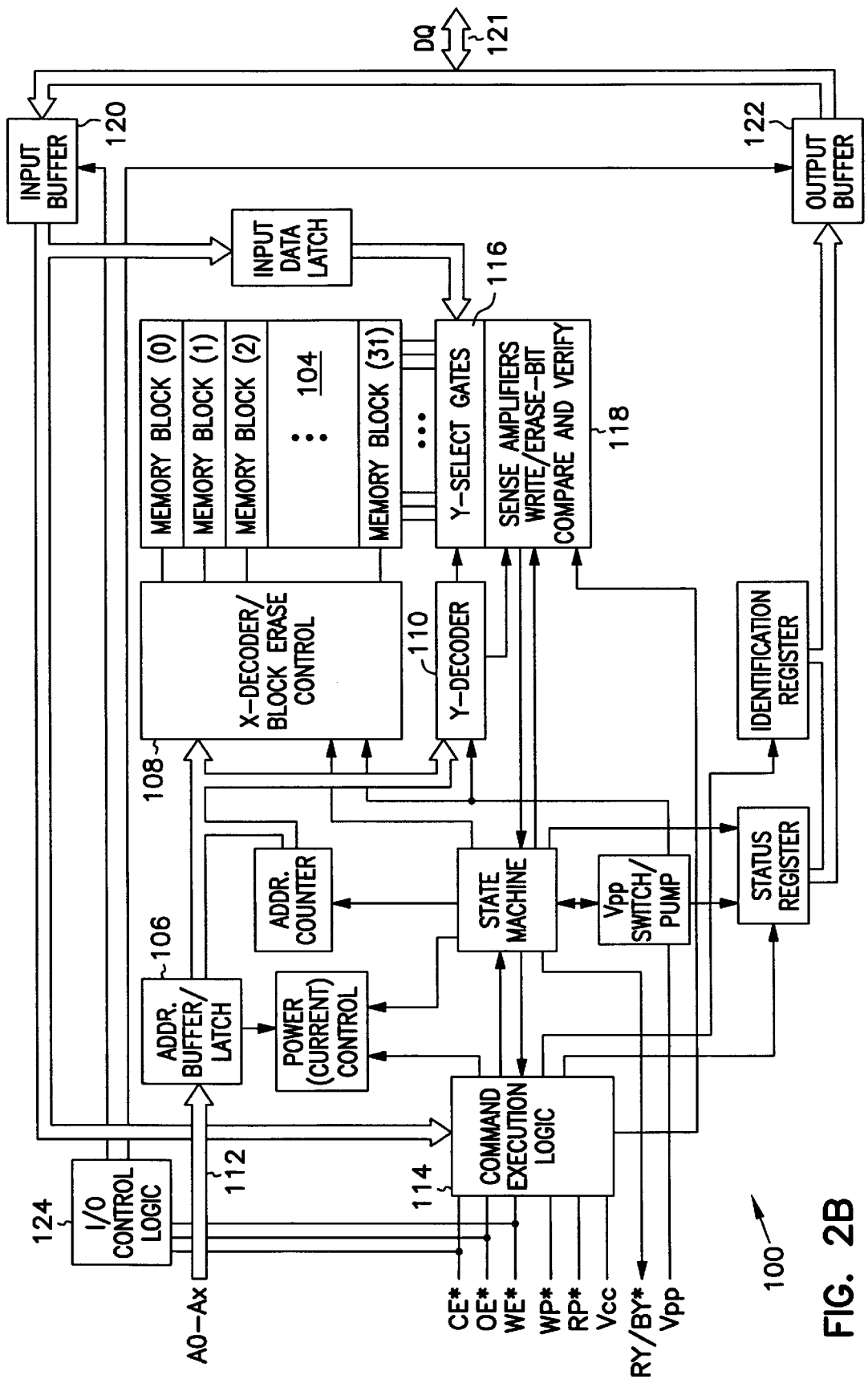
FIG. 2B is a detailed illustration of the flash memory of FIG. 2A.

It will be appreciated that more than one Flash memory can be included in various package configurations. For example, compact Flash memory cards 150 can be manufactured in varying densities using numerous Flash memories 100(1)–100(x) as illustrated in FIG. 2C. See "1997 Flash Memory Data Book" pages 3-1 to 3-3 available from Micron Quantum Devices, Inc. (incorporated herein by reference) for a more detailed description of a Flash memory card.

Typical flash memories comprise a memory array having a large number of memory cells arranged in blocks. Each of the memory cells is fabricated as a field-effect transistor having a control gate and a floating gate. The floating gate is capable of holding a charge, and is separated, by a layer of thin oxide, from source and drain regions contained in a substrate. Each of the memory cells can be electrically programmed (charged) by injecting electrons from the drain region through the oxide layer onto the floating gate. The charge can be removed from the floating gate by tunneling the electrons to the source through the oxide layer during an erase operation. Thus the data in a memory cell is determined by the presence or absence of a charge on the floating gate.

Flash memories have a typical word line voltage of about 5 volts during a read operation. A high voltage, however, is usually required for programming and erase operations in a flash memory. This high voltage (Vpp) is typically in the range of 10 to 13 volts, but can be higher. Thus, voltages other than 5 volts are typical for different memory circuits during various operations. During a programming operation, electrons are injected onto the floating gate by applying the high voltage (Vpp) to the control gate and about one-half Vpp to the drain region while the source region is grounded. Electron tunneling from the floating gate during an erase operation is accomplished by applying Vpp to the source region, connecting the control gate to ground potential and leaving the drain region electrically unconnected or floating. In another embodiment, an erase operation is performed with the source of memory cells at a fraction of Vpp and the word lines with a negative voltage around −10 volts.

Coupling Circuit

Figure 1A:
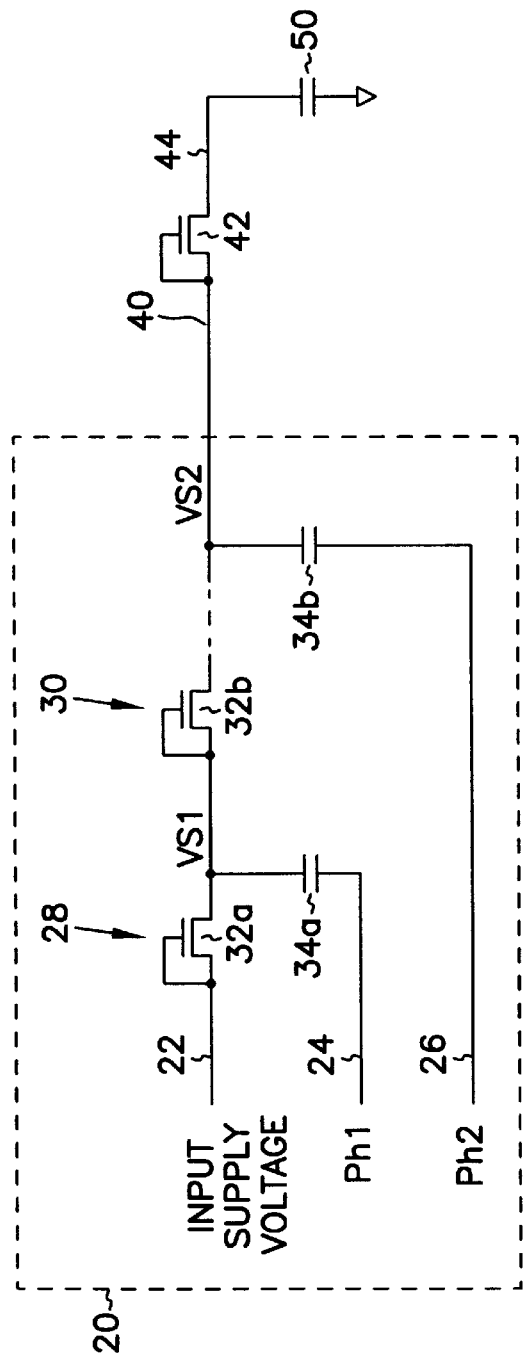
FIG. 1A is a schematic diagram of a prior art pump circuit.
Figure 1B:
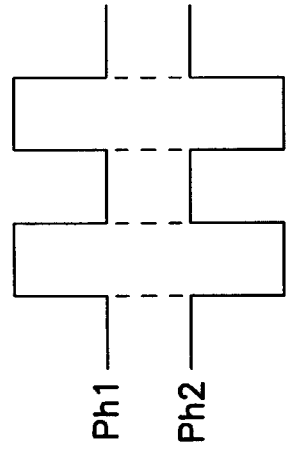
FIG. 1B is a timing diagram illustrating clock control signals used to control the operation of the pump circuit of FIG. 1A.
Figure 3:
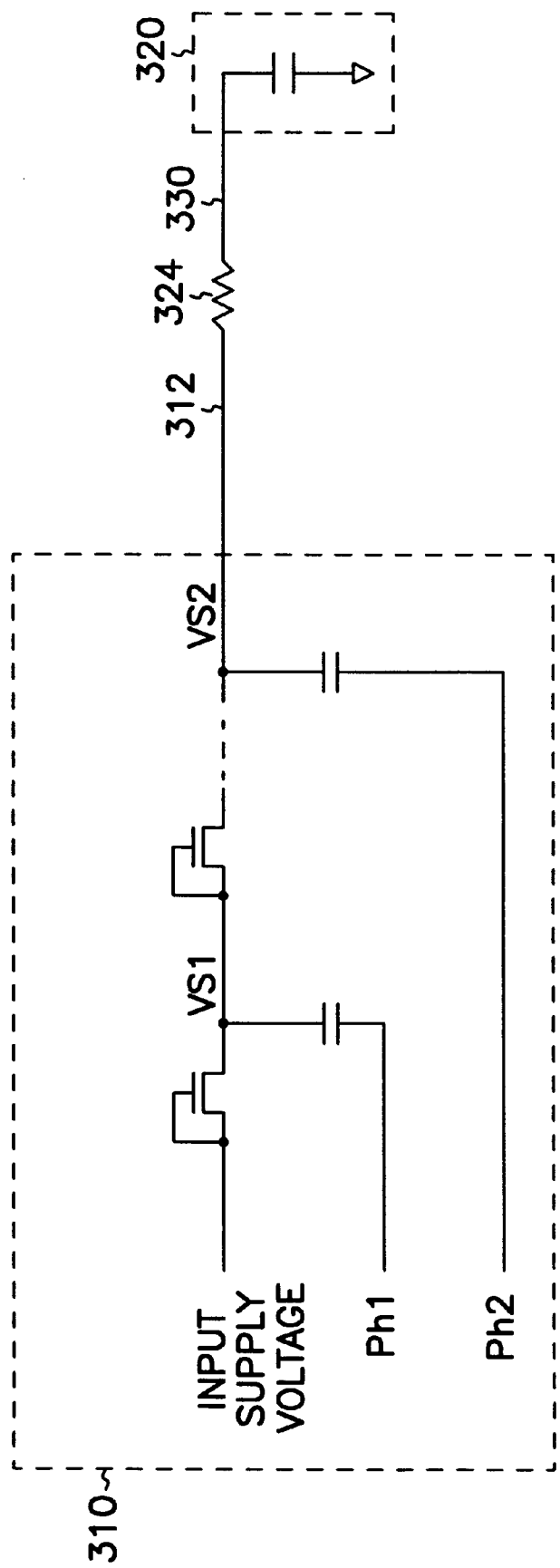
FIG. 3 illustrates an integrated circuit having a coupling circuit of the present invention.

Referring to FIG. 3, a portion of an integrated circuit 300 is illustrated as containing a charge pump 310 which has an output 312 coupled to a load 320 via a coupling circuit 324. Charge pump 310 is schematically equivalent to charge pump 20 of FIG. 1A. Because the load is capacitive in nature, it is illustrated generally as a capacitor. Likewise, the coupling circuit is illustrated generally as a resistor. The load can be any load in the integrated circuit which is coupled to internal node 330. As described above, the charge pump comprises stages of capacitors which are coupled together to produce an output voltage. The number of stages and other design factors are not critical to the present invention. That is, other than having a last capacitive stage, and no output diode, the specific design of the pump is left to one skilled in the art. By using a resistive coupling circuit, the charge pump can be designed to produce an output voltage which is closer to the desired load voltage. That is, unlike the conventional coupling circuit an excessive voltage drop is not experienced across the coupling circuit.

Figure 4:
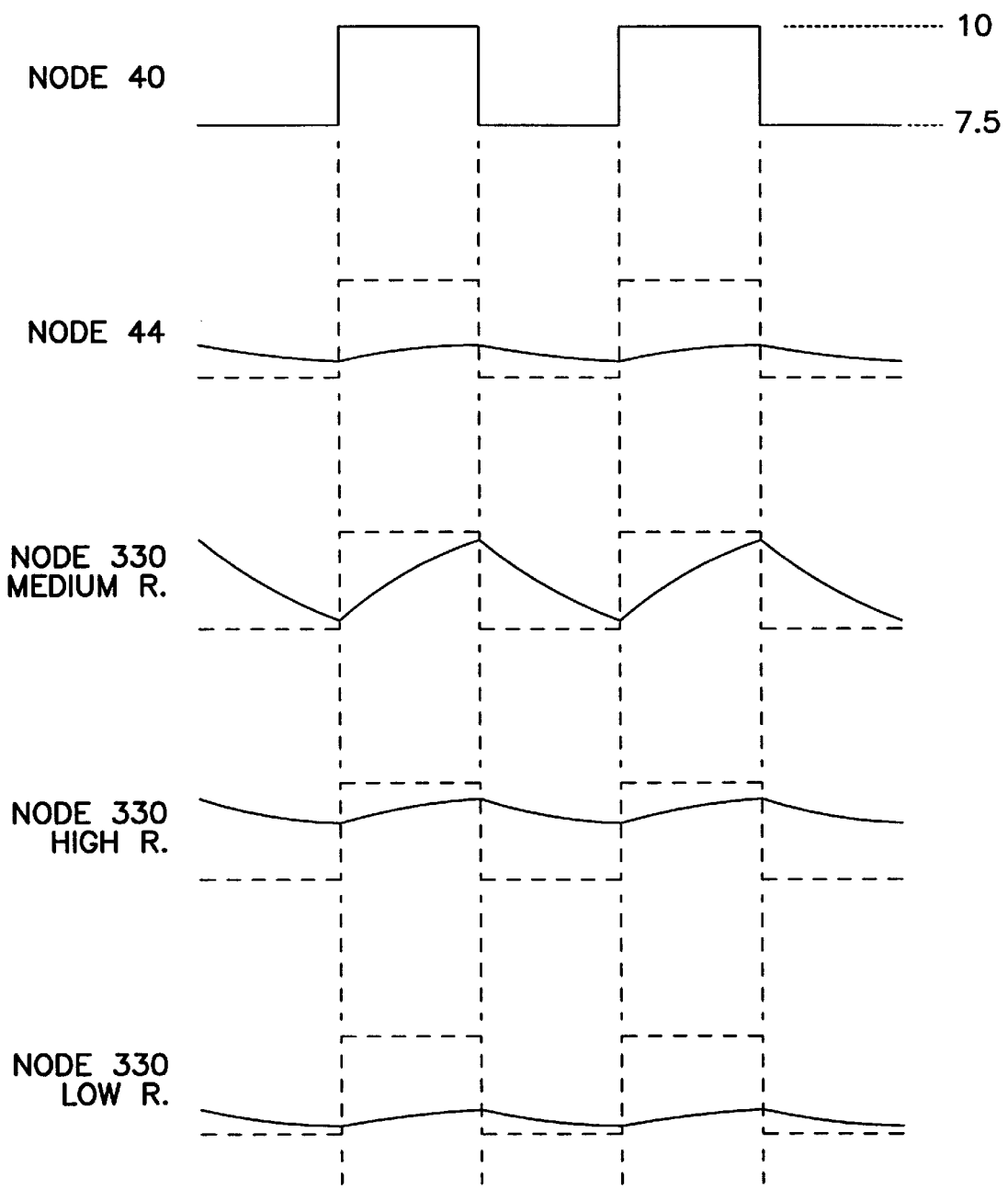
FIG. 4 shows a comparison of the load voltage provided using the circuits of FIG. 3 and FIG. 1A.

FIG. 4 shows a comparison of the load voltages on nodes 44 and 330. These load voltages are a result of similar output voltages of charge pumps 20 and 310, respectively coupled through diode coupled transistor 42 of FIG. 1A, and coupled through diodeless resistive coupling circuit 324. The voltage swing on the pump node 40 or 312 will be less than Vcc. For a Vcc value of 3 volts, the voltage swing on node 40 or 312 will be approximately 2.5 volts. Three different resistors are illustrated. The first has a medium resistance such that it acts like a low pass filter. The second signal is produced using a high resistance resistor, and maintains a voltage of approximately one-half the swing experienced by node 40 or 312. The third resistor has a low resistance which reduces the output swing. This is due to the capacitor load 320 acting as stray capacitance, such that the last stage of the charge pump fails to work properly. Actual resistance values are not provided herein and will depend upon the charge pump and capacitive load selected. As seen in the FIG., diode 42 reduces the output voltage by an n-channel threshold voltage (Vt). Typically, with back bias, Vt can be approximately 2 volts. Thus, the output voltage at node 44 will have a maximum of 8 volts (10−2 volts). Using a resistor value which allows the pump to work properly, the output voltage on node 330 will be on average one-half of the voltage swing on node 312 below the maximum voltage of node 312. That is, the voltage on node 330 is $V_{312} - \Delta V_{312}/2$. Assuming that $V_{312}$ is 10 volts for a Vcc of 3 volts, node 330 will be 8.75 volts (10−1.25 volts). Node 330, therefore, is higher than node 44 which had a Vt drop of 2 volts. The present invention is applicable at any Vcc level, but is useful at voltages below 3.6 volts, and where the Vt of a transistor is greater than one-half the voltage swing of the pump nodes. This is, at low Vcc levels a Vt under back bias is greater than ½ Vcc (the drop experienced by a resistive coupling circuit).

It will be appreciated by those skilled in the art, then a resistive coupling circuit is best used when the load is substantially capacitive in nature. For example, a resistive coupling circuit is ideally used in a memory device for coupling a charge pump to a memory array word line through decode circuitry. The resistive coupling circuit can be comprised of a single resistor, a plurality of resistors, or a coupling circuit which has substantially resistive characteristics. In one embodiment, the resistive coupling circuit can comprise a poly silicon resistor.

Conclusion

A charge pump coupling circuit has been described for more efficiently coupling a final capacitive stage of a charge pump to a capacitive load. The coupling circuit is described as being resistive to allow for a greater load voltage. The resistive coupling circuit is described in one embodiment in a memory device for coupling a charge pump to a memory array word line. The charge pump is coupled to the word lines through complex decoding circuitry and switches. The resistive coupling is part of this circuitry. Further, the resistive coupling circuit is described as either a single resistor, a plurality of resistors, or a coupling circuit which has substantially resistive characteristics.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A flash memory device comprising:
   an array of non-volatile memory cells comprising a plurality of substantially capacitive word lines for accessing the memory cells;
   a charge pump for producing an output voltage selectively coupled to the plurality of word lines; and
   a coupling resistor circuit having no diodes or transistors and connected between a capacitive output of the charge pump and decode circuitry coupled to the plurality of word lines for producing a word line voltage.

2. The flash memory device of claim 1 wherein the coupling resistor circuit is comprised of a poly silicon resistor.

3. The flash memory device of claim 1 wherein the coupling resistor circuit is a plurality of resistors.

4. The flash memory device of claim 1 wherein a supply voltage of the flash memory device is less than 3.6 volts.

5. A memory device comprising:
   a charge pump comprising a plurality of series coupled capacitive stages for producing an output voltage which is greater than an input voltage of the charge pump;
   a capacitive load circuit coupled to an output of the charge pump; and
   a coupling circuit connected to the output of the charge pump and the capacitive load circuit, the coupling circuit comprising a purely resistive circuit having no diodes or transistors such that an upper voltage level coupled to the capacitive load circuit is less than an n-type transistor voltage drop below the upper voltage level produced by the charge pump.

6. The memory device of claim 5 wherein the load circuit is a word line.

7. The memory device of claim 5 wherein the coupling circuit is a poly silicon resistor.

8. The memory device of claim 5 wherein the coupling circuit is a plurality of resistors connected between a capacitive output of the charge pump and decode circuitry coupled to a plurality of word lines for producing a word line voltage.

9. A method of increasing a load voltage on a capacitive load of an integrated circuit from a charge pump, the method comprising:

generating a charge pump output voltage having an upper voltage level from a charge pump; and coupling an output stage of the charge pump to the capacitive load through a resistive coupling circuit having no diodes or transistor, wherein a load voltage of the capacitive load has an upper voltage level which is less than an n-type transistor voltage drop below the upper voltage level produced by the charge pump.

10. The method of claim 9 wherein the integrated circuit is a memory device.

11. The method of claim 10 wherein the capacitive load is a memory array word line.

12. The method of claim 10 wherein a supply voltage of the memory device is less than 3.6 volts.

13. A flash memory device comprising:

an array of floating gate memory cells;

a plurality of wordlines, each wordline having a capacitance and being connected to selected ones of the memory cells;

a charge pump circuit having a plurality of pump capacitors to produce an output voltage at an output line; and a resistive coupling circuit having no diodes or transistors coupled between the output line of the charge pump and the wordlines to couple the output voltage to seleted ones of the wordlines.

14. The flash memory device of claim 13 wherein the resistive coupling circuit comprises a polysilicon resistor.

15. The flash memory device of claim 13 wherein the resistive coupling circuit comprises a resistor.

16. The flash memory device of claim 13 wherein the resistive coupling circuit comprises a plurality of resistors.

17. The flash memory device of claim 13 wherein one of the pump capacitors is connected to the output line of the charge pump circuit to produce the output voltage.

18. A flash memory device comprising:

a charge pump comprising a plurality of capacitive stages to generate an elevated output voltage on an output line which is greater than an input voltage coupled to the charge pump;

a wordline in an array of floating gate memory cells in the flash memory device, the wordline having a capacitance; and a resistive coupling circuit coupled between the output line of the charge pump and the wordline, the resistive coupling circuit having no diodes or transistors such that the wordline is coupled to receive a voltage from the resistive coupling circuit that falls below the elevated output voltage generated by the charge pump by less than a threshold voltage of a transistor or a voltage drop across a diode.

19. The flash memory device of claim 18 wherein the wordline is connected to a plurality of the floating gate memory cells and the voltage received by the wordline comprises a wordline voltage.

20. The flash memory device of claim 18 wherein the resistive coupling circuit comprises a resistor.

21. The flash memory device of claim 18 wherein the resistive coupling circuit comprises a polysilicon resistor.

22. The flash memory device of claim 18 wherein the resistive coupling circuit comprises a plurality of resistors.

23. The flash memory device of claim 18 wherein one of the capacitive stages comprises a pump capacitor connected to the output line to generate the elevated output voltage.

24. A system comprising:

a microprocessor; and a flash memory device coupled to the microprocessor through a plurality of data lines and control lines, the flash memory device comprising:

an array of floating gate memory cells;

a plurality of wordlines, each wordline having a capacitance and being connected to selected ones of the memory cells;

a charge pump circuit having a plurality of pump capacitors to produce an output voltage at an output line; and a resistive coupling circuit having no diodes or transistors coupled between the output line of the charge pump and the wordlines to couple the output voltage to selected ones of the wordlines.

25. The system of claim 24 wherein the resistive coupling circuit comprises a polysilicon resistor.

26. The system of claim 24 wherein the resistive coupling circuit comprises a resistor.

27. The system of claim 24 wherein the resistive coupling circuit comprises a plurality of resistors.

28. The system of claim 24 wherein one of the pump capacitors is connected to the output line of the charge pump circuit to produce the output voltage.

29. A flash memory device comprising:

an array of floating gate memory cells;

a plurality of wordlines, each wordline having a capacitance and being connected to selected ones of the memory cells;

a charge pump circuit having a plurality of pump capacitors to produce an output voltage at an output line; and means for coupling the output line of the charge pump circuit to the wordlines with a resistance and having no diodes or transistors.

30. A method comprising:

receiving a control signal in a flash memory device having an array of floating gate memory cells;

generating an elevated voltage in a charge pump circuit in the flash memory device; and coupling the elevated voltage to a wordline in the array through a resistive coupling circuit having no diodes or transistors to carry out an operation on a memory cell connected to the wordline in response to the control signal.

31. The method of claim 30 wherein coupling comprises coupling the elevated voltage to a wordline in the array through a polysilicon resistor.

32. The method of claim 30 wherein coupling comprises coupling the elevated voltage to a wordline in the array through a resistor.

33. The method of claim 30 wherein coupling comprises coupling the elevated voltage to a wordline in the array through a plurality of resistors.

34. The method of claim 30 wherein generating an elevated voltage comprises generating an elevated voltage in a charge pump circuit having a plurality of pump capacitors.

35. The method of claim 30 wherein coupling the elevated voltage comprises coupling the elevated voltage to a wordline in the array through a resistive coupling circuit having no diodes or transistors to carry out a data read, a data write, or an erase operation on a memory cell connected to the wordline in response to the control signal.

36. A method comprising:
receiving a control signal in a flash memory device having an array of floating gate memory cells;
generating an elevated voltage in a charge pump circuit in the flash memory device; and
coupling the elevated voltage to a wordline in the array through a resistive coupling circuit having no diodes or transistors such that the wordline receives a voltage that falls below the elevated voltage by less than a threshold voltage of a transistor or a voltage drop across a diode.

37. The method of claim 36 wherein coupling comprises coupling the elevated voyage to a wordline in the array through a polysilicon resistor such that the wordline receives a voltage that falls below the elevated voltage by less than a threshold voltage of a transistor or a voltage drop across a diode.

38. The method of claim 36 wherein coupling comprises coupling the elevated voltage to a wordline in the array through a resistor such that the wordline receives a voltage that falls below the elevated voltage by less than a threshold voltage of a transistor or a voltage drop across a diode.

39. The method of claim 36 wherein coupling comprises coupling the elevated voltage to a wordline in the array through a plurality of resistors such that the wordline receives a voltage that falls below the elevated voltage by less than a threshold voltage of a transistor or a voltage drop across a diode.

40. The method of claim 36 wherein generating an elevated voltage comprises generating an elevated voltage in a charge pump circuit having a plurality of pump capacitors.

41. The method of claim 36 wherein coupling the elevated voltage comprises coupling the elevated voltage to a wordline in the array through a resistive coupling circuit having no diodes or transistors to carry out a data read, a data write, or an erase operation on a memory cell connected to the wordline in response to the control signal.

42. A method comprising:
exchanging control signals and data signals between a microprocessor and a flash memory device having an array of floating gate memory cells;
generating an elevated voltage in a charge pump circuit in the flash memory device; and
coupling the elevated voltage to a wordline in the array through a resistive coupling circuit having no diodes or transistors to carry out an operation on a memory cell connected to the wordline in response to the control signals.

43. The method of claim 42 wherein coupling comprises coupling the elevated voltage to a wordline in the array through a polysilicon resistor.

44. The method of claim 42 wherein coupling comprises coupling the elevated voltage to a wordline in the array through a resistor.

45. The method of claim 42 wherein coupling comprises coupling the elevated voltage to a wordline in the array through a plurality of resistors.

46. The method of claim 42 wherein generating an elevated voltage comprises generating an elevated voltage in a charge pump circuit having a plurality of pump capacitors.

47. The method of claim 42 wherein coupling the elevated voltage comprises coupling the elevated voltage to a wordline in the array through a resistive coupling circuit having no diodes or transistors to carry out a data read, a data write, or an erase operation on a memory cell connected to the wordline in response to the control signals.

* * * * *